(12) United States Patent
Liu et al.

(10) Patent No.: US 11,177,242 B2
(45) Date of Patent: Nov. 16, 2021

(54) SEMICONDUCTOR DEVICE INCLUDING MAGNETIC HOLD-DOWN LAYER

(71) Applicant: WESTERN DIGITAL TECHNOLOGIES, INC., San Jose, CA (US)

(72) Inventors: Yangming Liu, Shanghai (CN); Ning Ye, San Jose, CA (US); Bo Yang, Milpitas, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 32 days.

(21) Appl. No.: 16/814,812

(22) Filed: Mar. 10, 2020

(65) Prior Publication Data
US 2020/0411477 A1 Dec. 31, 2020

(30) Foreign Application Priority Data
Jun. 28, 2019 (CN) .......................... 201910575682.1

(51) Int. Cl.
*H01L 25/065* (2006.01)
*H01L 23/31* (2006.01)
*H01L 23/00* (2006.01)

(52) U.S. Cl.
CPC ...... *H01L 25/0657* (2013.01); *H01L 23/3128* (2013.01); *H01L 23/562* (2013.01); *H01L 24/06* (2013.01); *H01L 24/29* (2013.01); *H01L 24/73* (2013.01); *H01L 2224/04042* (2013.01); *H01L 2224/2916* (2013.01); *H01L 2224/29155* (2013.01); *H01L 2224/29157* (2013.01); *H01L 2224/29193* (2013.01); *H01L 2224/73265* (2013.01); *H01L 2225/0651* (2013.01); *H01L 2225/06506* (2013.01); *H01L 2225/06562* (2013.01)

(58) Field of Classification Search
CPC ....... H01L 25/0657; H01L 2225/06562; H01L 2224/29455; H01L 2224/29157
See application file for complete search history.

(56) References Cited

U.S. PATENT DOCUMENTS

| | | | |
|---|---|---|---|
| 2007/0030659 A1 | 2/2007 | Suzuki et al. | |
| 2010/0129959 A1 | 5/2010 | Lim et al. | |
| 2015/0279791 A1* | 10/2015 | Yamada | H01L 23/645 257/531 |
| 2016/0064360 A1 | 3/2016 | Kim | |
| 2016/0329271 A1* | 11/2016 | Katti | H01L 23/49541 |

* cited by examiner

*Primary Examiner* — Dale E Page
*Assistant Examiner* — Wilner Jean Baptiste
(74) *Attorney, Agent, or Firm* — Vierra Magen Marcus LLP

(57) ABSTRACT

A semiconductor device is disclosed including one or more semiconductor dies mounted on substrate. Each semiconductor die may be formed with a ferromagnetic layer on a lower, inactive surface of the semiconductor die. The ferromagnetic layer pulls the semiconductor dies down against each other and the substrate during fabrication to prevent warping of the dies. The ferromagnetic layer also balances out a mismatch of coefficients of thermal expansion between layers of the dies, thus further preventing warping of the dies.

18 Claims, 7 Drawing Sheets

SEMICONDUCTOR DEVICE INCLUDING MAGNETIC HOLD-DOWN LAYER

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

In order to most efficiently use package footprint, it is known to stack semiconductor dies on top of each other. In order to provide access to bond pads on the semiconductor dies, the dies are stacked, either completely overlapping each other with a spacer layer in between adjacent dies, or with an offset. In an offset configuration, a die is stacked on top of another die so that the bond pads of the lower die are left exposed.

It is a problem with conventional stacked dies that the dies tend to warp or tilt upward at the non-wire bonded side prior to curing of the adhesive attach film holding the dies in the stack. This is, for example, due to the different coefficients of thermal expansion in semiconductor die layers as the dies cool after stacking. Prior art FIG. 1 shows an example of a conventional semiconductor package 50 including stacked memory dies 52 which have tilted upward off the substrate 54 at the non-wire bonded side. The dies are affixed to each and the substrate using a die attach film (DAF) layer. However, prior to curing of the DAF layer, warping of the dies potentially causes a peeling off of the DAF layer and a void between adjacent semiconductor dies and/or the bottommost die and the substrate.

This can be problematic for a few reasons. For example, silica particles from the mold compound can get in between the dies where the DAF has separated and the dies have warped. FIG. 1 shows an example of silica particles 56 under the bottom die. Under the pressure of the molding process, these silica particles 56 can cause die crack.

Moreover, in some instances, the dies may warp and tilt to the point where an edge of the top die extends through a surface of the encapsulating molding compound 56, where it is then exposed to the external environment. Package manufacturers print a package name, specifications, logo and/or other information on the package surface. Given the known protrusion of the die edge, the area where the die edge protrudes may be designated as a keep out area, where nothing can be printed. This limits a manufacturer's ability to print on the package surface.

DETAILED DESCRIPTION

Figure 1:
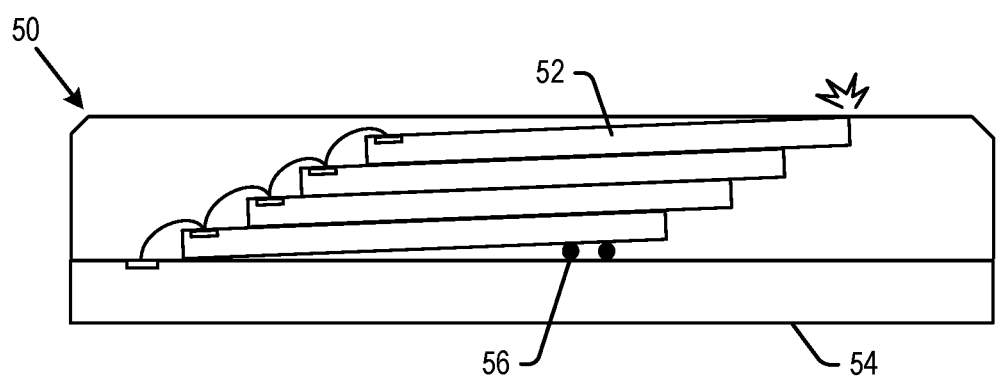
FIG. 1 is a cross-sectional edge view of die stack tilt in a conventional semiconductor package.

The present technology will now be described with reference to the figures, which in embodiments, relate to a semiconductor device including one or more semiconductor dies mounted on substrate. Each semiconductor die may be formed with a ferromagnetic layer on a lower, inactive surface of the semiconductor die. After fabrication, the one or more dies may be mounted on a substrate, which is itself mounted on a magnetic carrier. The magnetic carrier exerts an attractive magnetic force on the ferromagnetic layer of each of the dies, so as to pull the dies down against the substrate and to prevent the dies from tilting upwards during the die attach process. The magnetic carrier may be removed once a die attach film (DAF) on a lower surface of each of the dies is cured to fix the dies flat against the substrate.

The present technology enables reduction and/or elimination of die tilt at the overhang area, and the DAF adhesion and uniformity can be enhanced by the magnetic force, thus preventing die warping, and DAF void and peeling. Moreover, the ferromagnetic layer further balances a mismatch of the coefficients of thermal expansion of the different layers within the semiconductor dies, thus further preventing die warping, and DAF void and peeling.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension.

An embodiment of the present technology will now be explained with reference to the flowchart of FIG. 2, and the views of FIGS. 3-12. In step 200, a semiconductor wafer 100 may be processed into a number of semiconductor dies 102 as shown in FIG. 3. The semiconductor wafer 100 may start as an ingot of wafer material which may be monocrystalline silicon grown according to either a Czochralski (CZ) or floating zone (FZ) process. However, first wafer 100 may be formed of other materials and by other processes in further embodiments.

The semiconductor wafer 100 may be cut from the ingot and polished on both the first major planar surface 104, and second major planar surface 106 (FIG. 5) opposite surface 104, to provide smooth surfaces. The first major surface 104 may undergo various processes in step 200 to divide the wafer 100 into the respective semiconductor dies 102, and to form integrated circuits 121 of the respective semiconductor dies 102 on and/or in the first major surface 104. The number and pattern of semiconductor dies 102 shown on wafer 100 in FIG. 3 is for illustrative purposes, and wafer 100 may include more semiconductor dies 102 than are shown, and in different patterns, in further embodiments.

Figure 5:
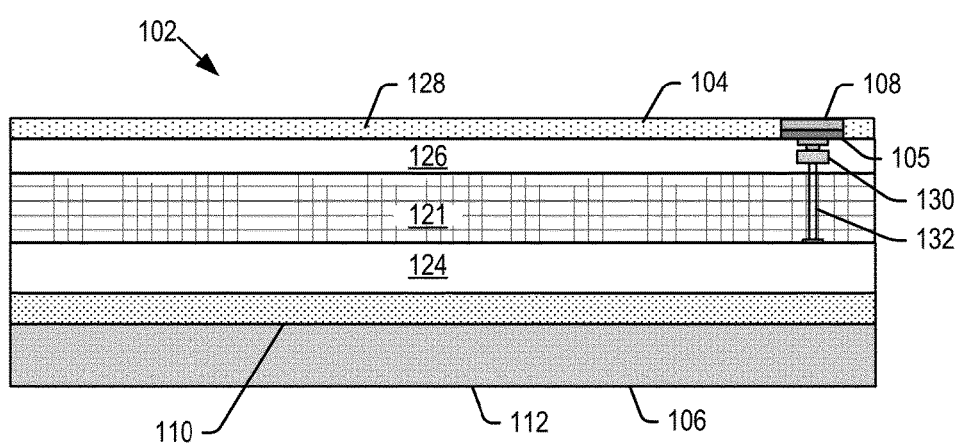
FIG. 5 is a cross-sectional edge view of a semiconductor die according to embodiments of the present technology.

The integrated circuits 121 formed in step 200 may include memory cells and logic formed in a dielectric substrate including layers 124 and 126 as shown in the cross-sectional edge view of FIG. 5. In embodiments, the integrated circuits 121 may be formed as a 3D stacked memory structure having strings of memory cells formed into layers. However, it is understood that the semiconductor die 102 may be processed to include integrated circuits other than a 3D stacked memory structure. A passivation/polyimide layer 128 may be formed on top of the upper dielectric film layer 126.

After formation of the integrated circuits 121, internal electrical connections may be formed within the semiconductor die 102 in step 204. The internal electrical connections may include multiple layers of metal interconnects 130 and vias 132 formed sequentially through layers of the dielectric film 126. As is known in the art, the metal interconnects 130, vias 132 and dielectric film layers 126 may be formed a layer at a time using photolithographic and thin-film deposition processes. The photolithographic processes may include for example pattern definition, plasma, chemical or dry etching and polishing. The thin-film deposition processes may include for example sputtering and/or chemical vapor deposition. The metal interconnects 130 may be formed of a variety of electrically conductive metals including for example copper and copper alloys as is known in the art, and the vias 132 may be lined and/or filled with a variety of electrically conductive metals including for example tungsten, copper and copper alloys as is known in the art.

Figure 4:
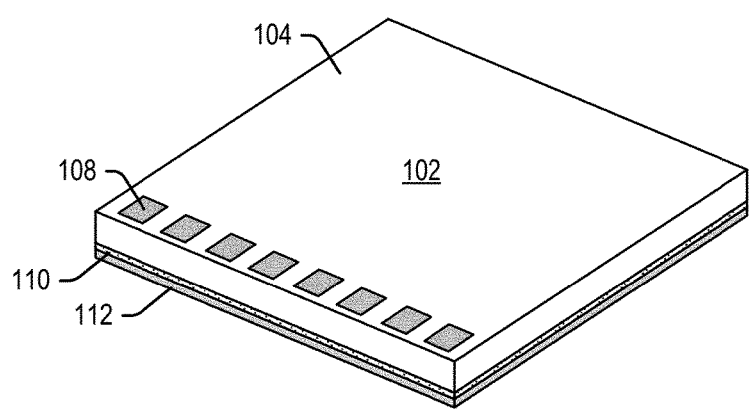
FIG. 4 is a perspective view of a semiconductor die according to embodiments of the present technology.

In step 208, bond pads may be formed on the major planar surface 104 of the semiconductor dies 102. As shown in FIGS. 4 and 5, these bond pads may include a row of bond pads 108, but it is understood that the bond pads 108 may be provided on the surface of die 102 in a variety of patterns and in various numbers. The passivation layer 128 may be etched, and each bond pad 108 may be formed over a liner 105 in the etched regions of the passivation layer. As is known in the art, the bond pads 108 may be formed for example of copper, aluminum and alloys thereof, and the liner 105 may be formed for example of a titanium/titanium nitride stack such as for example Ti/TiN/Ti, though these materials may vary in further embodiments. The bond pads 108 and liner 105 may be applied by vapor deposition and/or plating techniques. The bond pads and liners together may have a thickness of 720 nm, though this thickness may be larger or smaller in further embodiments. The integrated circuits 121 may be electrically connected to the bond pads 108 by the metal interconnects 130 and vias 132.

In step 210, the inactive surface of the wafer 100, and in particular, dielectric layer 124 may undergo a backgrind process to thin the wafer 100 to a final thickness. In embodiments, the final thickness of the wafer may for example be 30 μm to 40 μm, though the final thickness may be lesser or greater than that in further embodiments.

In accordance with aspects of the present technology, a ferromagnetic layer 110 may next be formed on the inactive surface of wafer 100, and in particular, on dielectric layer 124. The ferromagnetic layer 110 may be formed for example of iron, steel, stainless steel (Fe), nickel (Ni), cobalt (Co), graphene, or other materials subject to magnetic forces. It may be applied by sputtering or other thin film deposition methods such as chemical vapor deposition and physical vapor deposition. Layer 110 may be formed of ferrimagnetic materials instead of, or in addition, to ferromagnetic materials. Moreover, in addition to non-magnetic materials, the layer 110 may itself be formed of a magnetic material, including for example alnico (Aluminum Nickel Cobalt alloy) or various ferrites (ceramic-like material that is made from a mix of iron oxides with nickel, strontium, or cobalt). Such a magnetic material may be provided with a magnetic pole opposite that of the magnet of the carrier 134 as explained below.

Figure 6:
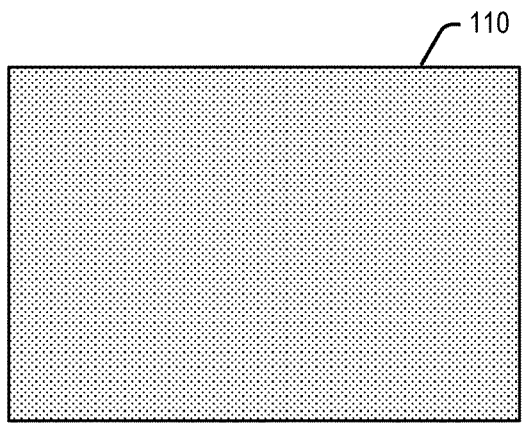
FIG. 6 is a top view of a continuous planar ferromagnetic layer of a semiconductor die according to embodiments the present technology.
Figure 7:
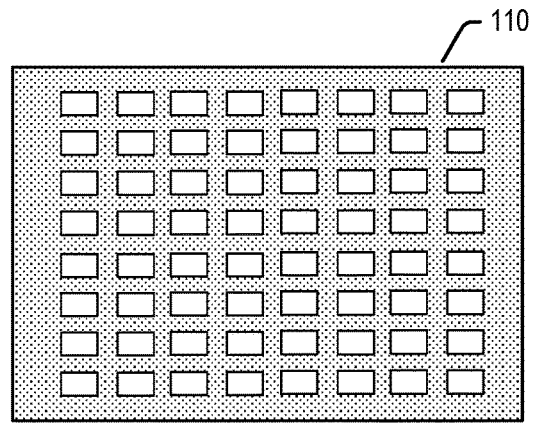
FIGS. 7-9 are top views of further embodiments of a ferromagnetic layer of a semiconductor die according to embodiments the present technology.
Figure 8:
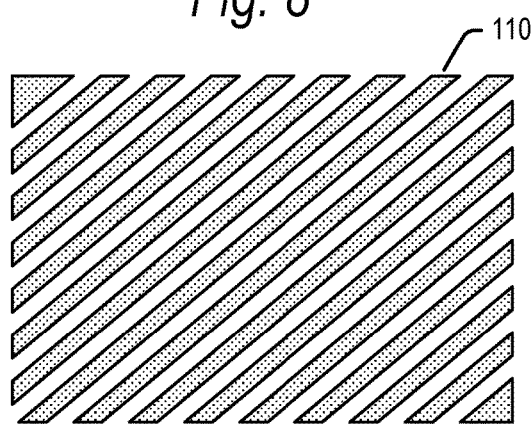
Figure 9:
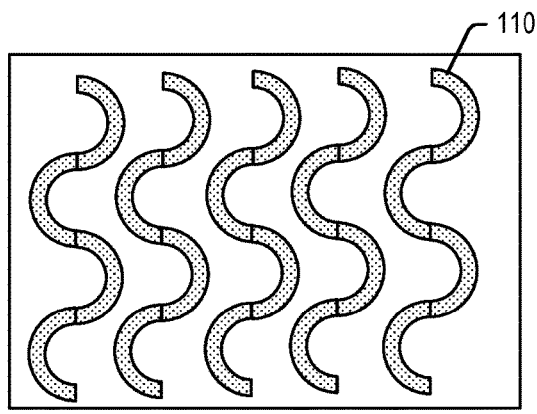

In embodiments, the layer 110 may be a solid continuous (no voids) planar layer of material as shown in the top view of FIG. 6. In further embodiments, the layer 110 may be patterned with straight or curved sections of material with voids therebetween, as shown for examples in FIGS. 7-9. Other patterns are contemplated. In embodiments, the ferromagnetic layer 110 may be 1 μm to 2 μm, though it may be thinner or thicker than that in further embodiments.

Figure 2:
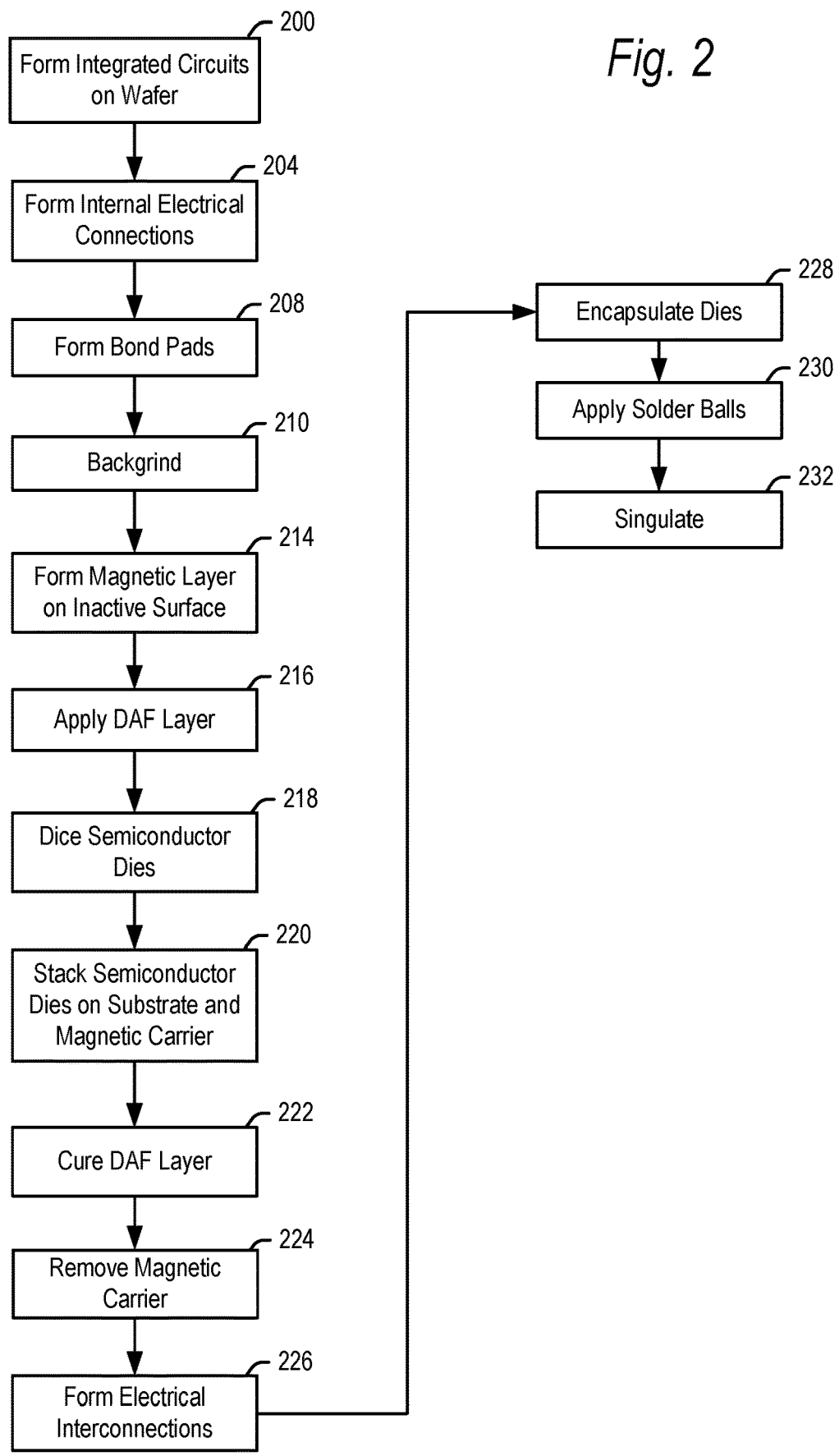
FIG. 2 is a flowchart for forming a semiconductor device according to embodiments of the present technology.
Figure 3:
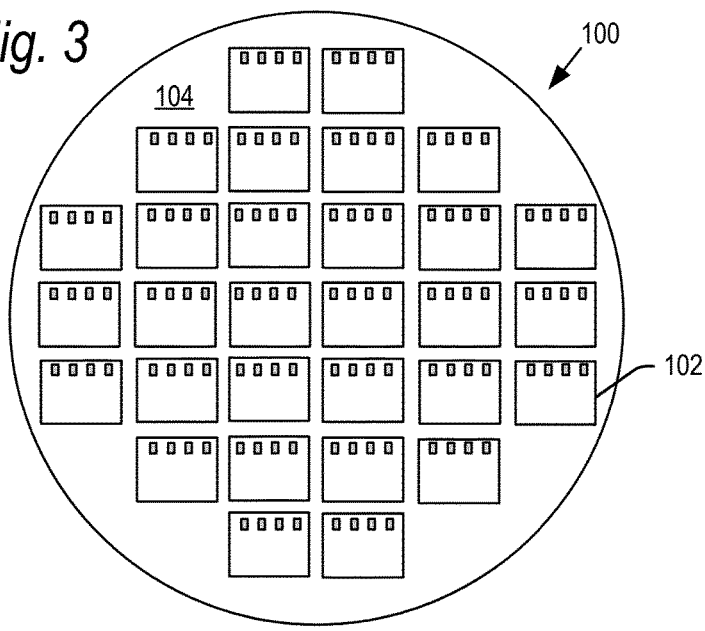
FIG. 3 is a top view of a semiconductor wafer according to embodiments of the present technology.

Referring again to the flowchart of FIG. 2 and the cross-sectional view of FIG. 5, a die attach film (DAF) layer 112 may be affixed over ferromagnetic layer 110 in step 216. As one example, the DAF layer 112 may be 8988UV epoxy from Henkel AG & Co. KGaA, though other types of films may be used. The DAF layer 112 may be 5 μm to 10 μm, though it may be thinner or thicker than that, and may be applied by spin-coating or other methods and cured to a B-stage. As explained below, the DAF layer may be cured to final C-stage after the dies 102 are stacked on a substrate and magnetic carrier.

In step 218, the individual dies may be diced from wafer 100 by known methods such as for example by laser or saw blade to provide individual semiconductor dies 102 such as that shown in FIG. 4.

Figure 10:
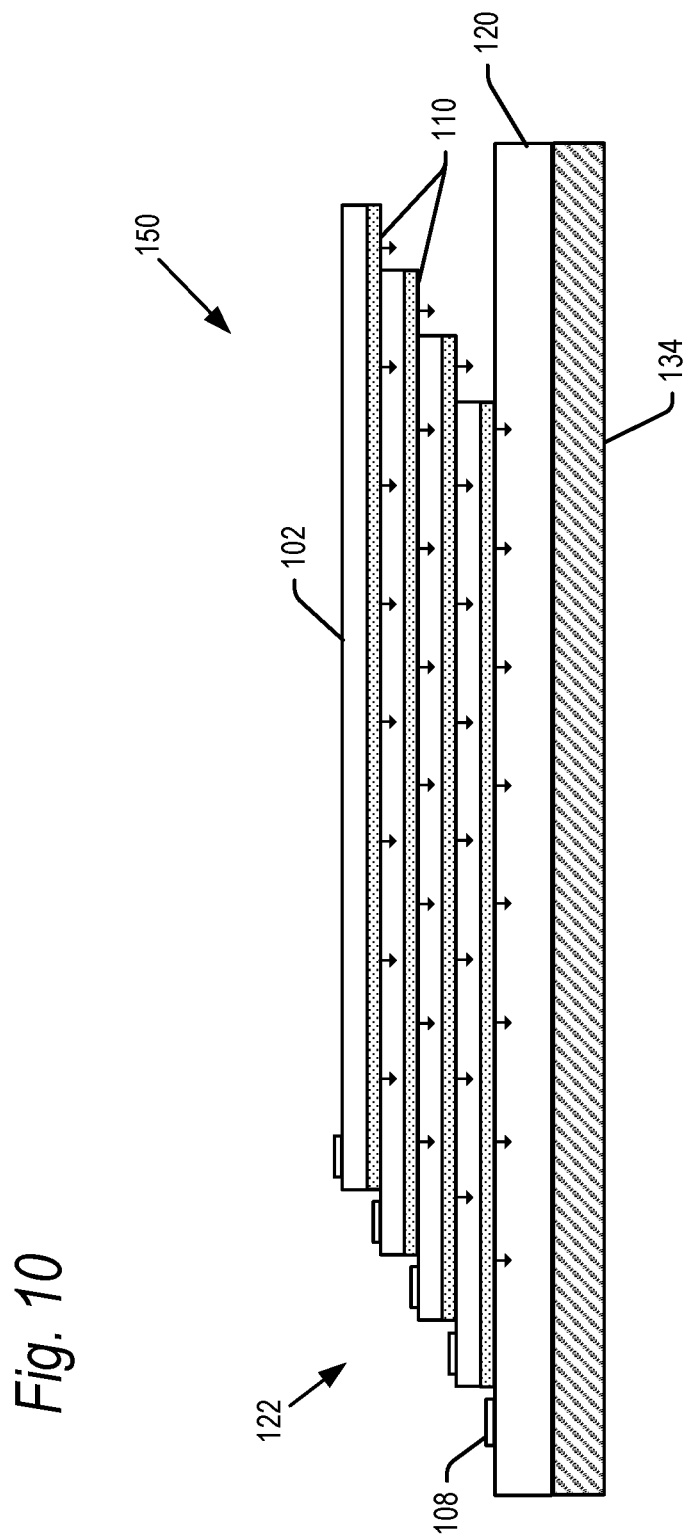
FIG. 10 is an example of a semiconductor device including a number of stacked dies at a first stage of fabrication according to embodiments of the present technology.

In step 220, one or more semiconductor dies 102 may be mounted on a substrate 120, as shown in the edge view of FIG. 10. The semiconductor dies 102 may for example be flash memory die such as 2D NAND flash memory or 3D BiCS (Bit Cost Scaling), V-NAND or other 3D flash memory, but other types of dies 102 may be used. These other types of semiconductor dies include but are not limited to controller dies such as an ASIC, or RAM such as an SDRAM, DDR SDRAM, LPDDR and GDDR. The number of dies 102 shown in the stack 122 is by way of example only, and embodiments may include different numbers of semiconductor dies, including for example 1, 2, 4, 8, 16, 32 or 64 dies. There may be other numbers of dies in further embodiments.

Where multiple semiconductor dies 102 are included, the semiconductor dies 102 may be stacked atop each other in an offset stepped configuration to form a die stack 122 as shown for example in FIG. 10. The dies may be stacked with an offset, such that the die bond pads 108 on a die in the stack remain exposed and uncovered by the next upper die. The dies 102 may be heated when stacked on each other and substrate 120, for example to 150° C., to soften the b-stage DAF layers 112 and facilitate proper stacking. After the dies are stacked in step 220, the die stack 122 may be cooled to room temperature.

As explained in the Background section, conventional dies tend to warp and/or bend upward as shown in prior art FIG. 1 upon cooling after being stacked, for example due to the different coefficients of thermal expansion of the different layers of the semiconductor dies 102. In accordance with aspects of the present technology, the substrate 120 may further be mounted on a magnetic carrier 134 which exerts a magnetic force against the ferromagnetic layer 110 in the respective dies 102 in stack 122, pulling them down flat against each other and the substrate 120.

Magnetic carrier 134 may be or include a permanent magnet, formed for example of alnico (Aluminum Nickel Cobalt alloy) or various ferrites (ceramic-like material that is made from a mix of iron oxides with nickel, strontium, or cobalt). The permanent magnet may have an upper surface supporting a lower surface of the substrate 120. Alternatively, the permanent magnet may be mounted within a housing, which housing has an upper surface supporting a lower surface of the substrate 120. In this example, the housing itself may be a ferromagnetic or non-ferromagnetic material.

The magnetic carrier 134 may alternatively include an electromagnet having a conductive wire wrapped around ferromagnetic core, such that the electromagnet becomes magnetic upon a current through the wire. In such an example, the wire may be copper and the core may be iron or other ferromagnetic material. The electromagnet may be mounted within a housing, which housing has an upper surface supporting a lower surface of the substrate 120. In this example, the housing itself may be a ferromagnetic or non-ferromagnetic material.

As noted above, at this point in the fabrication process, the substrate 120 may be part of a panel of substrates. In this instance, there may be a single carrier 134 for the entire panel of substrates. Alternatively, each substrate 120 may have its own carrier 134. The substrate(s) 120 may be affixed to the carrier 134 with a removable adhesive.

As indicated by the arrows in FIG. 10, the magnetic carrier 134 exerts an attractive force on the ferromagnetic layer 110 of each of the dies 102 in the die stack 122. The attractive force may be large enough to overcome any forces tending to warp the dies 102 or pull the ends of the dies up off the substrate or each other. Thus, under the attractive force of the magnetic carrier, each of the dies 102 may lie flat against the die below it, and the bottommost die 102 may lie flat against the substrate 102.

With the dies held securely against each other and the substrate under the magnetic force of the magnetic carrier, the DAF layer 112 of each of the dies may be cured in step 222 from a b-stage to a final c-stage to permanently affix the dies 102 to each other and the substrate 120. The DAF layer 112 may be hardened to the c-stage by heat and pressure. In one example, the die stack 122 may be heated to 150° C. for several hours to cure the DAF layers 112, though the temperature and duration may vary in further embodiments.

In addition to heat, the pressure resulting from the attractive magnetic force further ensures a tight and secure bonding of the dies 102 to each other and the substrate during the curing process. Upon curing of the DAF layers 112, the dies are fixed in position in the stack and no warping or tilting of the dies occurs after curing. Once the DAF layers 112 are cured, the substrate may be separated from the magnetic carrier 134 in step 224. In embodiments, the magnetic carrier may may be used from the time the dies 102 are stacked on the substrate 120 in step 220 until after the DAF layers 112 are cured in step 222.

Figure 11:
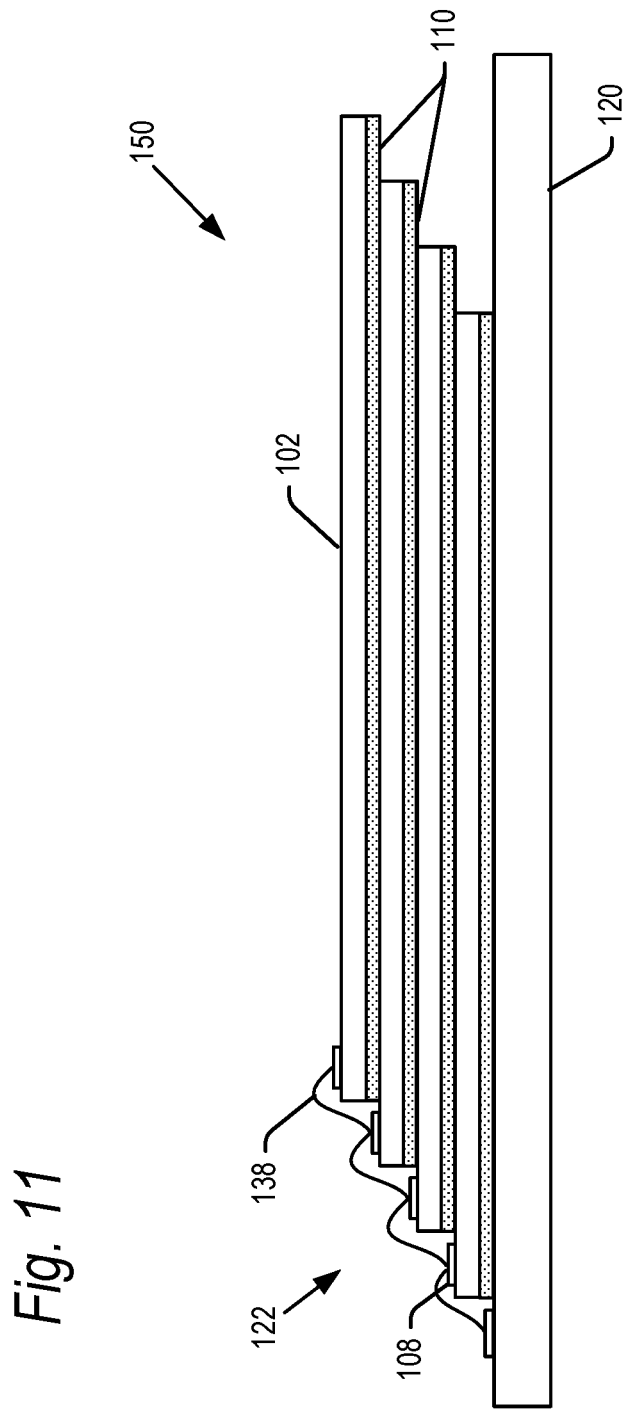
FIG. 11 is an example of a semiconductor device including a number of stacked dies at a second stage of fabrication according to embodiments of the present technology.

In step 226, the semiconductor dies 102 may be electrically interconnected to each other and to the substrate 120. FIG. 11 shows an edge view of wire bonds 138 being formed between corresponding die bond pads 108 on respective dies 102 down the stack 122, and then bonded to contact pads on an upper surface of the substrate 120. The wire bonds may be formed by a ball-bonding technique, but other wire bonding techniques are possible. The semiconductor dies 102 may be electrically interconnected to each other and the substrate 120 by other methods in further embodiments, including by through-silicon vias (TSVs).

Figure 12:
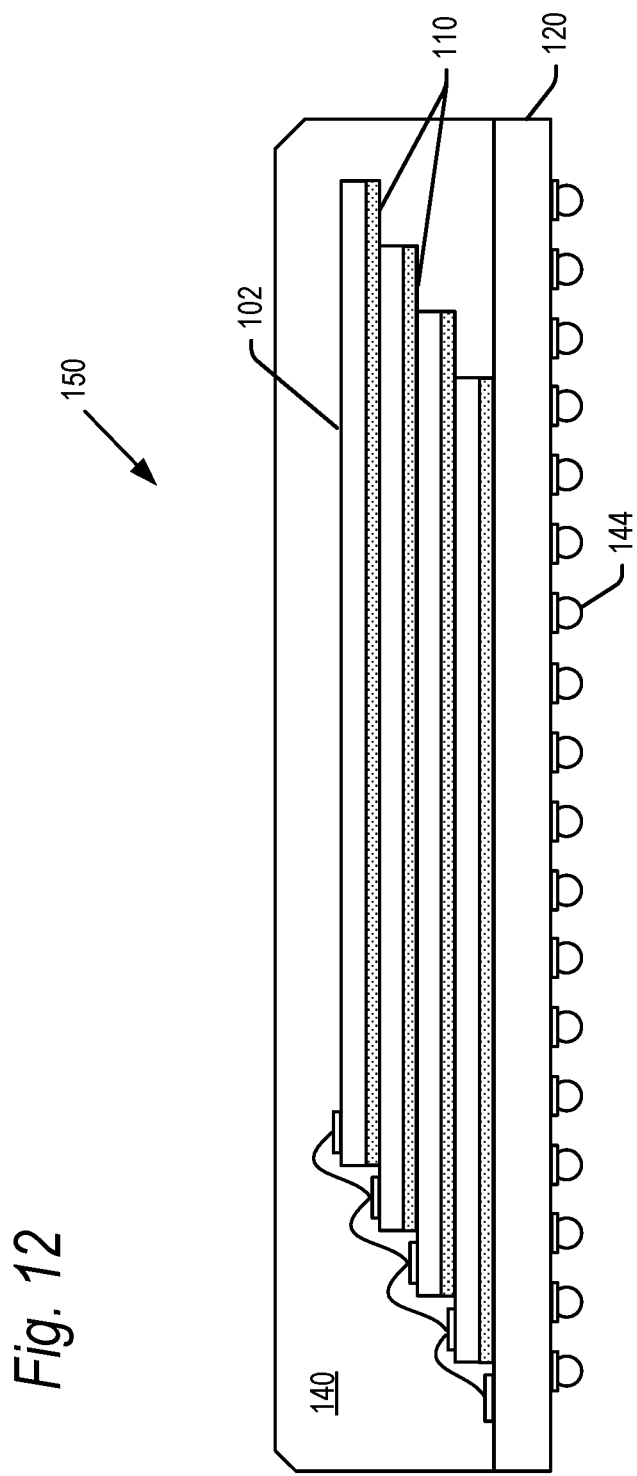
FIG. 12 is an example of a completed semiconductor device including a number of stacked dies according to embodiments of the present technology.

Following electrical connection of the dies 102 to the substrate 120, the semiconductor device 150 may be encapsulated in a mold compound 140 in a step 228 and as shown in FIG. 12. Mold compound 140 may include for example solid epoxy resin, Phenol resin, fused silica, crystalline silica, carbon black and/or metal hydroxide. Other mold compounds are contemplated. The mold compound may be applied by various known processes, including by compression molding, FFT (flow free thin) molding, transfer molding or injection molding techniques.

Where the semiconductor device 150 is a BGA (ball grid array) package, solder balls 144 may be affixed to the contact pads on a lower surface of substrate 120 in step 230 as shown in FIG. 12. The solder balls 144 may be used to solder the semiconductor device 150 to a host device (not shown), such as a printed circuit board. Where the semiconductor device 150 is an LGA (land grid array) package, solder balls 144 may be omitted.

As noted above, the semiconductor device 150 may be formed on a panel of substrates. After formation and encapsulation of the substrates 100, the substrates 100 may be singulated from each other in step 232 to form a finished semiconductor device 150 as shown in FIG. 12. The semiconductor devices 150 may be singulated by any of a variety of cutting methods including sawing, water jet cutting, laser cutting, water guided laser cutting, dry media cutting, and diamond coating wire cutting. While straight line cuts will define generally rectangular or square shaped semiconductor devices 150, it is understood that semiconductor device 150 may have shapes other than rectangular and square in further embodiments of the present technology.

The inclusion of the ferromagnetic layer 110 at the bottom of the dies 102 provides several advantages. First, upon mounting on the magnetic carrier, the ferromagnetic layer 110 of each die serves to pull the dies down flat against each other and the substrate.

Second, the ferromagnetic layer 110 of each die 102 serves to balance the different coefficients of thermal expansion that otherwise tend to warp dies when they are cooled after stacking. In particular, referring again to FIG. 5, the coefficient of thermal expansion (CTE) of the passivation/polyimide layer 128 is relatively large, about 20 ppm/k. The CTE of the integrated circuit layer 121 is about 10-15 ppm/k, and the CTE of the dielectric layer 124 is about 3 ppm/k. The dies 102 are mounted on the substrate at an elevated temperature, for example 150° C. As the dies 102 cool to room temperature after stacking, the relatively larger shrinkage of the passivation/polyimide layer 128 and circuit layer 121 causes warping in conventional designs.

In accordance with further aspects of the present technology, the ferromagnetic layer 110 on the bottom surface of the dies 102 also has a relatively large CTE, for example 10-15 ppm/k. Provision of the ferromagnetic layer 110 on the bottom surface of the dies 102 balances the CTE mismatch between the respective layers on dies 102, and further prevents warping of the dies as they cool. In particular, the CTE of the integrated circuit layer 121 and ferromagnetic layer 110 may be about equal to each other and both are greater than a coefficient of thermal expansion of the dielectric layer 124 provided therebetween. Similarly, the CTE of the passivation/polyimide layer 128 and ferromagnetic layer 110 are both greater than a coefficient of thermal expansion of the dielectric layer 124 provided therebetween.

In summary, an example of the present technology relates to a semiconductor device, comprising: a substrate; and a plurality of semiconductor dies stacked on the substrate with a stepped offset from each other, each semiconductor die comprising: a group of die bond pads on a first surface of the die, and a ferromagnetic layer on a second surface of the die, the ferromagnetic layers of the semiconductor dies configured to pull the plurality of semiconductor dies toward the substrate and to balance a mismatch of coefficients of thermal expansion in layers of the dies of the plurality of semiconductor dies.

In another example, the present technology relates to a semiconductor device, comprising: a substrate; and a plurality of semiconductor dies stacked on the substrate, each semiconductor die comprising: an integrated circuit layer, a dielectric layer, and a ferromagnetic layer, the integrated circuit layer provided on a first side of the dielectric layer and the ferromagnetic layer provided on a second side of the dielectric layer, the plurality of semiconductor dies stacked on the substrate with an offset such that the groups of die bond pads on each semiconductor die are left exposed, the ferromagnetic layers of the semiconductor dies configured to pull the plurality of semiconductor dies toward the substrate and to balance a mismatch of coefficients of thermal expansion in the integrated circuit layer and dielectric layer.

In another example, the present technology relates to a semiconductor device, comprising: a substrate; and a plurality of semiconductor dies stacked on the substrate with a stepped offset from each other, each semiconductor die comprising: a group of die bond pads on a first surface of the die, and ferromagnetic means for pulling the plurality of semiconductor dies toward the substrate and for balancing a mismatch of coefficients of thermal expansion in layers of the dies of the plurality of semiconductor dies.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:
a substrate; and
a plurality of semiconductor dies stacked on the substrate with a stepped offset from each other, each semiconductor die comprising:
a group of die bond pads on a first surface of the die, and
a ferromagnetic layer on a second surface of the die, the ferromagnetic layers of the semiconductor dies configured to pull the plurality of semiconductor dies toward the substrate and to balance a mismatch of coefficients of thermal expansion in layers of the dies of the plurality of semiconductor dies;
wherein each semiconductor die comprises an integrated circuit layer and a dielectric layer, the integrated circuit layer provided on a first side of the dielectric layer and the ferromagnetic layer provided on a second side of the dielectric layer.

2. The semiconductor device of claim 1, wherein the ferromagnetic layer of each die in the plurality of semiconductor dies is a continuous planar layer.

3. The semiconductor device of claim 1, wherein the ferromagnetic layer of each die in the plurality of semiconductor dies is patterned to include voids.

4. The semiconductor device of claim 1, wherein the ferromagnetic layer of each die in the plurality of semiconductor dies is 1 µm to 2 µm thick.

5. The semiconductor device of claim 1, wherein the ferromagnetic layer of each die in the plurality of semiconductor dies comprises one of iron, steel, stainless steel, nickel, cobalt and graphene.

6. The semiconductor device of claim 1, further comprising a plurality of die attach film layers for adhering the plurality of dies to each other and the substrate.

7. The semiconductor device of claim 1, wherein a coefficient of thermal expansion of the integrated circuit layer and ferromagnetic layer are greater than a coefficient of thermal expansion of the dielectric layer.

8. The semiconductor device of claim 1, wherein each semiconductor die further comprises a passivation/polyimide layer, the passivation/polyimide layer provided on the first side of the dielectric layer.

9. The semiconductor device of claim 8, wherein a coefficient of thermal expansion of the passivation/polyimide layer and ferromagnetic layer are greater than a coefficient of thermal expansion of the dielectric layer.

10. A semiconductor device, comprising:
a substrate; and
a plurality of semiconductor dies stacked on the substrate, each semiconductor die comprising:
an integrated circuit layer,
a dielectric layer, and
a ferromagnetic layer, the integrated circuit layer provided on a first side of the dielectric layer and the ferromagnetic layer provided on a second side of the dielectric layer, the plurality of semiconductor dies stacked on the substrate with an offset such that the groups of die bond pads on each semiconductor die are left exposed, the ferromagnetic layers of the semiconductor dies configured to pull the plurality of semiconductor dies toward the substrate and to balance a mismatch of coefficients of thermal expansion in the integrated circuit layer and dielectric layer;

wherein the ferromagnetic layer of each die in the plurality of semiconductor dies is a planar layer.

11. The semiconductor device of claim 10, wherein each semiconductor die further comprises a passivation/polyimide layer, the passivation/polyimide layer provided on the first side of the dielectric layer.

12. The semiconductor device of claim 11, wherein a coefficient of thermal expansion of the passivation/polyimide layer and ferromagnetic layer are greater than a coefficient of thermal expansion of the dielectric layer.

13. The semiconductor device of claim 10, wherein the ferromagnetic layer of each die in the plurality of semiconductor dies is a continuous planar layer.

14. The semiconductor device of claim 10, wherein the ferromagnetic layer of each die in the plurality of semiconductor dies is patterned to include voids.

15. The semiconductor device of claim 10, wherein the ferromagnetic layer of each die in the plurality of semiconductor dies comprises one of iron, steel, stainless steel, nickel, cobalt and graphene.

16. The semiconductor device of claim 10, further comprising a plurality of die attach film layers for adhering the plurality of dies to each other and the substrate.

17. The semiconductor device of claim 10, wherein the plurality of semiconductor dies comprise flash memory dies.

18. A semiconductor device, comprising:
a substrate; and
a plurality of semiconductor dies stacked on the substrate with a stepped offset from each other, each semiconductor die comprising:
a group of die bond pads on a first surface of the die, and
ferromagnetic means for pulling the plurality of semiconductor dies toward the substrate and for balancing a mismatch of coefficients of thermal expansion in layers of the dies of the plurality of semiconductor dies;
wherein each semiconductor die further comprises:
an integrated circuit layer,
a dielectric layer, the integrated circuit layer provided on a first side of the dielectric layer and the ferromagnetic means provided on a second side of the dielectric layer, the ferromagnetic means further balancing a mismatch of coefficients of thermal expansion in the integrated circuit layer and dielectric layer.

* * * * *